United States Patent [19]

Neugebauer

[11] Patent Number: 4,801,864
[45] Date of Patent: Jan. 31, 1989

[54] TESTER FOR TERMINAL POST RESISTANCE FOR AN ENERGY STORAGE ELEMENT CONNECTED IN AN ELECTRICAL CIRCUIT

[75] Inventor: Dieter Neugebauer, Regenstauf, Fed. Rep. of Germany

[73] Assignee: Siemens Aktiengesellschaft, Berlin and Munich, Fed. Rep. of Germany

[21] Appl. No.: 35,468

[22] Filed: Apr. 7, 1987

[30] Foreign Application Priority Data

Apr. 7, 1986 [DE] Fed. Rep. of Germany ....... 3611562

[51] Int. Cl.⁴ ............................................. G01R 27/04
[52] U.S. Cl. ........................................ 324/62; 324/421
[58] Field of Search ................. 324/421, 62, 525, 538, 324/64

[56] References Cited

U.S. PATENT DOCUMENTS 3,731,189  5/1973  Sharaf et al. .
4,104,578  8/1978  Thuot ..................................... 324/421
4,251,811  2/1981  Wittlinger ........................ 324/435 X
4,491,797  1/1985  Velsher ................................ 324/421

FOREIGN PATENT DOCUMENTS 661410  5/1979  U.S.S.R. ............................ 324/421

Primary Examiner—Reinhard J. Eisenzopf
Assistant Examiner—Robert W. Mueller
Attorney, Agent, or Firm—Hill, Van Santen, Steadman & Simpson

[57] ABSTRACT

A resistance checker portion for terminal posts of an energy storage device includes a series branch formed of an ohmic resistor at a switch connected in parallel to the energy storage device through the terminal posts. Brief closing of the noramlly open switch causes a voltage jump in the series branch which is a direct measurement of the resistance of the terminal posts. An evaluator measures the voltage jump and calculates the contact resistance of the terminal posts therefrom.

6 Claims, 1 Drawing Sheet

TESTER FOR TERMINAL POST RESISTANCE FOR AN ENERGY STORAGE ELEMENT CONNECTED IN AN ELECTRICAL CIRCUIT

BACKGROUND OF THE INVENTION

1. Field of the Invention

The present invention is directed to a tester for testing contact resistance of terminal posts for connecting an energy storage device to an electrical apparatus.

2. Description of the Related Art

An energy storage device, such as a supply battery, an auxiliary power supply, or a buffer capacitor, is often connected to an electrical apparatus by terminal posts to enable the energy storage device to be easily replaced.

It has been determined that contact resistances of the terminal posts by which the energy storage devices are connected sometimes increase so greatly due to faulty replacement or due to corrosion that the effective operation of the energy storage devices is placed in doubt. This effect is a particular problem in energy storage devices which are intended for only occasional, or even one-time use, and for which no current flow is provided over long time spans.

SUMMARY OF THE INVENTION

It is an object of the present invention to monitor, in a particularly simple way, contact resistances of terminal posts at which energy storage devices are connected. This and other objects of the invention are achieved in a tester, or checker, apparatus connected in a series branch of a circuit across the energy storage device, the tester including a switch and an ohmic resistor. All types of mechanical as well as electromagnetic switches and semiconductor switches may be utilized as the switch in the tester. Actuation of the switch can be accomplished either manually or by a programmed actuator which emits switch-associated control instructions.

Measurement of the contact resistances of the terminals occurs as follows: when the switch is open, the full voltage of the energy storage device is present in the series branch connected across the energy storage device since no current flows through the series branch. Only after the switch has been closed does a current flow from the energy storage device through any resistance that has developed at the terminal posts and through the resistor in the series branch. The resulting voltage jump arising in the series branch is measured by an evaluator which calculates the size of the contact resistance of the terminal posts.

The evaluator, for example, is a threshold stage connected to measure the voltage in the series branch. The threshold stage is set to respond when the contact resistance, and, thus, the voltage discontinuity in the series branch exceeds an allowable limit value. Thus, the response of the threshold stage is an indication that the contact resistances are too high.

Another advantage of the present resistance tester is that the amplitude of the voltage of the energy storage device enters into the measurement of the contact resistances and, thus, can also be monitored to determine whether the energy storage device has a low voltage.

DESCRIPTION OF THE PREFERRED EMBODIMENTS

Figure 1:
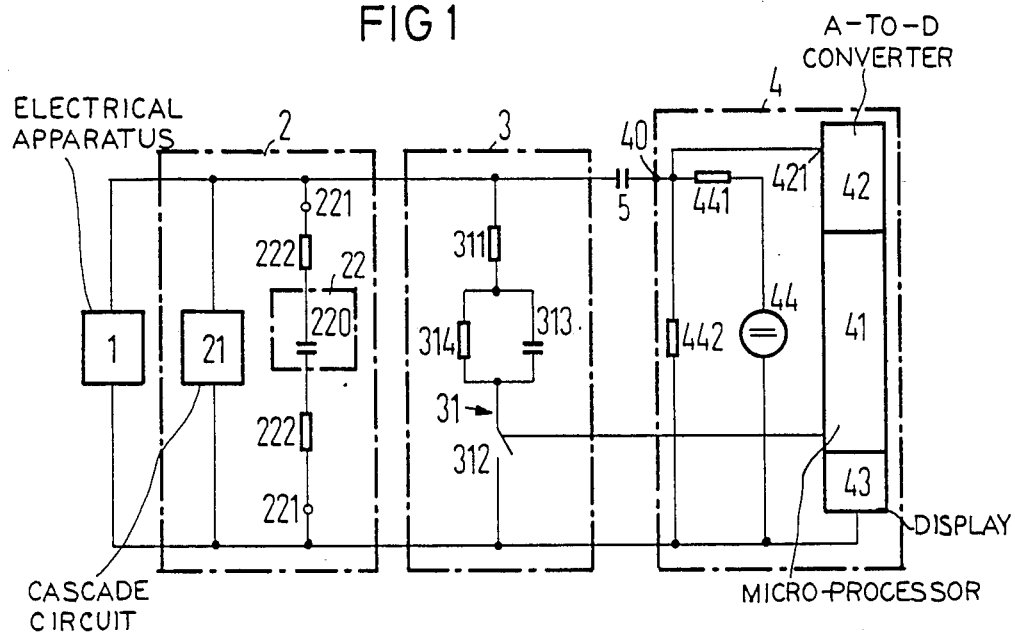
FIG. 1. is an electrical diagram of an exemplary embodiment of the present invention.

In the circuit of FIG. 1, an electrical apparatus 1 is shown which, for example, is a trigger circuit for a motor vehicle air bag system. The ignition energy for triggering release of the air bag is supplied by an energy source 2 shown in broken outline. The energy source 2 includes a cascade circuit 21 and an energy storage device 22, which is a capacitor 220, and preferably an electrolytic capacitor. The cascade circuit 21 transforms the DC voltage of a motor vehicle battery (not shown) to an adequately high value. The cascade circuit 21, thus, represents a voltage source having a high internal resistance which charges the capacitor 220 at a high time constant, but which is not in a position to supply power for the ignition of the air bag system. For the same reason, the influence of the cascade circuit 21 shall be left out of the consideration in the following description of the resistance check sequence.

Only the charged capacitor 220 serves as the energy storage device 22 for the ignition of the air bag system. Therefore, the proper operation of the energy storage device 22 is of critical significance during an emergency situation. Due to its limited useful life, the capacitor 220 is formed as a replaceable part having terminal posts 221, such as with screw connections, for connection across the trigger circuit 1 and cascade circuit 21. Since the presence, as well as the low impedance involvement, of the capacitor 220 is a prerequisite to the functioning of the air bag system, it is necessary to monitor the contact resistances 222 of the terminal posts 221. It is to be understood that a combined contact resistance 223 corresponds to the sum of the two contact resistances 222 of the two terminal posts 221.

A monitoring apparatus for the combined contact resistance 223 is formed of a checker, or test, part 3 and an evaluator 4, each enclosed by a broken outline. The evaluator 4 has an input 40 connected to the checker 3 by a coupling capacitor 5.

The checker portion 3 is connected in parallel to the capacitor 220 and is formed of a series branch 31 having a resistor 311, a switch 312, and a parallel circuit formed by a capacitor 313 and a resistor 314. In the example, the switch 312 is a transistor, although other types of switches can be utilized as well. The switch 312 is inhibited during normal operation and is only briefly activated by the evaluator 4 for a measurement event.

Figure 2:
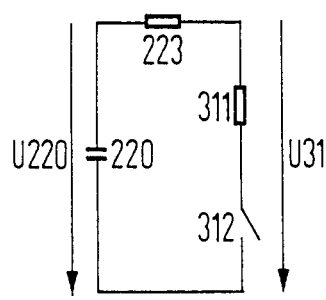
FIG. 2 is a mesh diagram from the circuit of FIG. 1 showing the voltage present with the switch open.

FIG. 2 shows a mesh diagram of the capacitor 220, the combined contact resistance 223 and the series branch 31 when the switch 312 is opened. Voltages U220 and U31 are superimposed on the mesh diagram.

Figure 3:
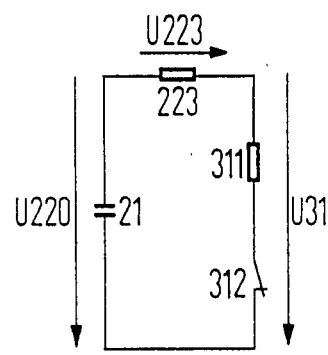
FIG. 3 is the mesh diagram of FIG. 2 showing the voltage immediately after the switch is closed.

In FIG. 3, the same mesh diagram is shown immediately after the switch 312 is closed. In addition to the voltages U220 and U31, the voltage U223 is present. By comparing the voltage conditions of FIGS. 2 and 3, a voltage jump, or change, ΔU31 occurs in the series branch 31. The voltage change U31 is identical to the voltage drop U223 that arises across the combined contact resistance 223. Deriving by equation is:

$$\Delta U31 = U220 \frac{R223}{R223 + R311} \quad (1)$$

The voltage jump, of difference, ΔU31 which occurs during measurement, allows the combined contact resistance 223 to be directly calculated.

The precision and the reliability of the resistance evaluation depend upon the size of the voltage difference ΔU31. This, in turn, depends upon the impedance of the resistor 311 in the series branch 31. Equation (1) can be rewritten as follows:

$$\Delta U31 = U220 \frac{1}{1 + \frac{R311}{R223}} \quad (2)$$

The voltage difference ΔU31 thus becomes greater for smaller values of R331/R223.

A combined contact resistance 223 which is of an inadmissible magnitude, may still be extremely small. Therefore, the impedance of the resistor 311 is selected to be roughly on the order of magnitude of an inadmissible combined contact resistance value in order to obtain a clear voltage difference ΔU31. During the measurement sequence, however, such impedance values for the resistor 311 would yield high currents through the series branch and, thus, through the capacitor 220 and the transistor switch 312.

A further development of the present invention is to alleviate the high currents by the parallel circuit formed by the capacitor 313 and the resistor 314 in the series branch 31. At the first moment following closing of the switch 312, the small capacitance value capacitor 313 represents a short circuit so that it does not impede the actual measurement. Since, however, the capacitor 313 is quickly charged, it soon interrupts the current flux. Thereafter, only a small residual current can flow through the series branch 31 by way of the parallel resistor 314, which has a relatively large resistance value. After the transistor switch 312 again interrupts the series branch 31, the capacitor 313 discharges through the parallel resistor 314 to restore the initial condition to the circuit.

The evaluator 4 includes a processor 41 which has connected at its input side, an analog-to-digital converter 42 including an input 421. The analog-to-digital converter 42 is supplied with a reference voltage formed by a voltage source 44 and a voltage divider that includes resistors 441 and 442. The reference voltage is applied to the input 421 and the voltage difference ΔU31 from the series branch 31 is overlaid thereon. When the switch 312 is open, the coupling capacitor 5 separates the potentials of the reference voltage and the voltage at the capacitor 220.

The processor 41, which is preferably a mircoprocessor, has an output supplied to the base of the transistor switch 312 in the check portion 3. An individual measurement of the combined contact resistance 223 occurs upon a single closing and opening of the transistor switch 312 by the output of the microprocessor 41. In a preferred development, the microprocessor 41 carries out five individual measurements successively at short intervals, and forms a mean value therefrom. The mean value of the five individual measurements eliminates possible errors which can occur in individual measurements.

Finally, the measured results are compared to a limit value, and an alarm signal is generated when the measured value exceeds the limit value. In other words, an alarm is sounded when the combined contact resistance 223 assumes an inadmissible value. As a result of the alarm signal, a display portion 43, such as an LED, is driven so that illumination of the LED signals an improper combined contact resistance 223.

A further advantage of the present checker or tester, is that the individual measurements consume little energy so that the measurements can be periodically repeated. The microprocessor 41, for example, can carry out a measuring interval every 10 seconds, so that the combined contact resistance 223 is periodically monitored and the operating reliability of the air bag system is, thus, significantly improved.

In one example, the capacitor 220 has a capacitance of 4700 microfarads, the capacitor 313 has a value of 10 microfarads, and the capacitor 5 has a value of 2.2 microfarads. The resistor 311 is a 68 ohm resistor, while the resistor 314 has a value of 10k ohms. The capacitor 220 is charged to a voltage U222 of 36 volts. A voltage source 44 is at 5 volts to provide a threshold level at 421 of 400 millivolts. This threshold establishes an inadmissible combined contact resistance 223 of greater than or equal to 300 milliohms.

Although other modifications and changes may be suggested by those skilled in the art, it is the intention of the inventor to embody within the patent warranted hereon all changes and modifications as reasonably and properly come within the scope of his contribution to the art.

I claim as my invention:

1. A contact resistance checker of terminal posts of an energy storage device connectable in an electrical apparatus, comprising:
   a check portion connected in parallel to said energy storage device through said terminal posts; said check portion including:
   a series circuit branch having a selectively operable transistor switch connected in series with a first resistor and in series a capacitor connected in parallel to a second resistor;
   means for actuating said transistor switch so that a voltage jump occurs at said series branch when said switch is actuated; and
   an evaluator having an input connected to said series branch of said check portion to measure the contact resistance from the voltage jump at said series branch when said switch is actuated.

2. A constant resistance checker as claimed in claim 1, wherein said evaluator includes a microprocessor connected to control said switch of said checker portion.

3. A constant resistance checker as claimed in claim 2, further comprising:
   a coupling capacitor connected between said checker portion and said input of said evaluator.

4. A constant resistance checker as claimed in claim 1, wherein said energy storage device is a capacitor.

5. A contact resistance checker for terminal posts of an energy storage device, comprising:
   a circuit branch connected across said terminals of said energy storage device, said circuit branch including:
   a first resistance element,
   a selectively operable switch connected in series with said first resistance element,
   a parallel circuit connected in series with said first resistance element and said switch, said parallel circuit including a second resistance element and a capacitor connected in parallel to said second resistance element; and means for evaluating voltages appearing across said circuit branch when said switch is opened and when said switch is closed.

6. A contact resistance checker as claimed in claim 5, further comprising:
 means for setting a threshold voltage;
 program controlled means for operating said switch; and
 means for supplying said threshold voltage and said voltage across said circuit branch to said program controlled means.

* * * * *